(12) United States Patent
Krohn

(10) Patent No.: US 6,290,881 B1
(45) Date of Patent: *Sep. 18, 2001

(54) ULTRAVIOLET CURABLE SILVER COMPOSITION AND RELATED METHOD

(75) Inventor: Roy C. Krohn, Fort Gratiot, MI (US)

(73) Assignee: Allied Photochemical, Inc., Fort Gratiot, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/413,577

(22) Filed: Oct. 6, 1999

Related U.S. Application Data

(63) Continuation-in-part of application No. 09/291,774, filed on Apr. 14, 1999, now abandoned.

(51) Int. Cl.$^7$ ............................... G03C 1/00; H01B 1/02
(52) U.S. Cl. ..................... 252/600; 252/514; 252/501.1
(58) Field of Search .................... 252/600, 514, 252/501.1

(56) References Cited

U.S. PATENT DOCUMENTS

| | | |
|---|---|---|
| Re. 30,274 | 5/1980 | Bolon et al. . |
| Re. 31,411 | 10/1983 | Bolon et al. . |
| 3,968,056 | 7/1976 | Bolon et al. . |
| 3,988,647 | 10/1976 | Bolon et al. . |
| 4,049,844 | 9/1977 | Bolon et al. . |
| 4,088,801 | 5/1978 | Bolon et al. . |
| 4,188,449 | 2/1980 | Lu et al. . |
| 4,496,475 | 1/1985 | Abrams . |
| 4,594,315 | 6/1986 | Shibue et al. . |
| 4,640,981 | 2/1987 | Dery et al. . |
| 4,828,758 * | 5/1989 | Gillberg-Laforce ................. 252/600 |
| 4,900,763 * | 2/1990 | Kraushaar ........................... 252/600 |
| 4,911,796 | 3/1990 | Reed . |
| 4,959,178 | 9/1990 | Frentzel et al. . |
| 4,960,614 | 10/1990 | Durand . |
| 4,964,948 | 10/1990 | Reed . |
| 5,006,397 | 4/1991 | Durand . |
| 5,049,480 | 9/1991 | Nebe et al. . |
| 5,068,714 | 11/1991 | Seipler . |
| 5,149,971 | 9/1992 | McElhaney et al. . |
| 5,180,523 | 1/1993 | Durand et al. . |
| 5,326,636 | 7/1994 | Durand et al. . |
| 5,395,876 | 3/1995 | Frentzel et al. . |
| 5,424,182 | 6/1995 | Marginean, Sr. et al. . |
| 5,453,451 | 9/1995 | Sokol . |
| 5,470,643 * | 11/1995 | Dorfman .............................. 252/600 |
| 5,773,487 | 6/1998 | Sokol . |
| 5,784,197 | 7/1998 | Frey et al. . |
| 5,866,628 | 2/1999 | Likavec et al. . |
| 5,914,162 | 6/1999 | Bilkadi . |
| 6,165,386 * | 12/2000 | Endo et al. ........................... 252/514 |

FOREIGN PATENT DOCUMENTS

| | | |
|---|---|---|
| 0 081 323 A | 9/1983 | (EP) . |
| 0 820 217 A | 1/1998 | (EP) . |

OTHER PUBLICATIONS

XP002140477, English language abstract for JP 06 016721 A published Jan. 25, 1994, Nippon Kayaku KK.
XP002140476, English language abstract for JP 05 311103 A published Nov. 22, 1993, Tanaka Kikinzoku Kogyo KK.

* cited by examiner

Primary Examiner—Philip Tucker
(74) Attorney, Agent, or Firm—Brooks & Kushman P.C.

(57) ABSTRACT

A photocurable silver composition is provided which comprises an ultraviolet light curable organic mixture, a photoinitiator, a silver powder, and a silver flake composition. The silver flake composition comprises at least 20% of the weight of the silver powder. The disclosed compositions may be used to produce silver-containing coatings on a variety of different substrates. Related methods are provided.

35 Claims, No Drawings

ULTRAVIOLET CURABLE SILVER COMPOSITION AND RELATED METHOD

CROSS-REFERENCE TO RELATED APPLICATIONS

This application is a continuation-in-part of U.S. application Ser. No. 09/291,774, filed Apr. 14, 1999 abandoned.

TECHNICAL FIELD

The present invention relates to silver-containing compositions and more particularly to photocurable silver-containing compositions, to methods for making and applying a photocurable silver-containing compositions as a coating on a substrate.

BACKGROUND ART

There are many instances in which it is necessary or desirable to apply a coating, plating or layer of silver or a silver-containing compound to a substrate. Examples of such applications would include electrode plating for switches such as those used on pressure-sensitive switches or control panels, for example, as are used on appliances such as microwave ovens, conventional ovens, and the like. Such silver plating also is commonly used in the semiconductor fabrication arts to apply silver metalizations on silicon or germanium semiconductor wafers. Other examples of such substrates include, without limitation, such things as polyesters, polycarbonates, vinyls, ceramics, glass, and the like.

The predominant approach heretofore used in applying silver to substrates has involved using a solvent-based silver solution to the substrate, and chemically or thermally curing the solution to evaporate the solvent. This leaves the solid silver plating on the substrate.

This conventional approach is disadvantageous in a number of respects. Of perhaps the greatest concern is the fact that the solvents currently used for this purpose are toxic. They require special handling and disposal facilities and techniques, and correspondingly increase inefficiencies and costs. Even while observing these special handling techniques, they present hazards to workers using these toxic materials. The solvent-based compositions and methods also are disadvantageous in that it can be difficult to predict the uniformity and thickness of the resultant silver plating after the solvent has evaporated. This leads to quality and performance variations.

SUMMARY OF THE INVENTION

Accordingly, an object of the present invention is to provide a silver composition and method in which silver can be disposed on a substrate without requiring a toxic solvent.

Another object of the invention is to provide a silver composition and method in which disposition of the silver layer can be done more quickly and efficiently than prior art solvent-based techniques.

Another object of the invention is to provide a silver composition and method in which a silver coating may be created which has more predictable and uniform layer thickness relative to prior art solvent-based systems.

To achieve the foregoing objects, and in accordance with the purposes of the invention as embodied and broadly described in this document, a silver composition is provided for deposition as a coating, plating, film or layer on a substrate. The terms coating, plating, film and layer in the context of this document are used to refer generally to a covering on the surface of a substrate, which covering may be of a variety of thicknesses depending on the application and the design goals.

DISCLOSURE OF INVENTION

In accordance with one aspect of the invention, a photocurable silver composition is provided. The silver composition comprises a photocurable organic mixture, a photoinitiator, a silver powder, and a silver flake composition. The silver flake composition is present in an amount of at least 20% of the weight of the silver powder present in the composition.

The photocurable silver composition preferably comprises an aliphatic acrylated oligomer, wherein the aliphatic acrylated oligomer is present in an amount of about 3% to 8% based on the weight of the silver composition. All percentages of the silver composition as expressed in this document, unless otherwise stated, refer to the mass percentage of the stated component to the total mass of the silver composition in its fluid uncured state at standard temperature and pressure.

The silver composition also preferably comprises an acrylated epoxy oligomer, wherein the acrylated epoxy oligomer is present in an amount of about 2% to 4% of the silver composition.

The silver composition also preferably comprises an isobornyl acrylate monomer in an amount of about 4% to 8% of the silver composition, a photoinitiator in an amount of about 3% to 6% of the silver composition, a flow promoting agent in an amount of about 0.1% to 2% of the silver composition, a silver powder in an amount of about 50% to 60% of the silver composition, and a silver flake composition in an amount of about 25% to 35% of the silver composition.

In accordance with this aspect of the invention, the aliphatic acrylated oligomer preferably comprises a urethane oligomer. In presently preferred versions of the silver composition, the aliphatic acrylated oligomer is present in an amount of about 8% of the silver composition.

The acrylated epoxy oligomer is preferably present in an amount of about 3% of the silver composition. The isobornyl acrylate monomer is preferably present in an amount of about 5% of the silver composition. The photoinitiator is preferably present in an amount of about 5% of the silver composition. The flow promoting agent is preferably present in an amount of about 1% of the silver composition.

In presently preferred embodiments according to this aspect of the invention, the silver powder preferably but optionally is present in an amount of about 52% of the silver composition. In these preferred embodiments, the silver powder has a particle size range of about 5 microns to about 15 microns. In a more preferred embodiment, the silver powder has a particle distribution such that about 5% to 20% of the particles have a particle size of less than about 4.7 microns, about 30% to 60% of the particles have a particle size of less than about 7.6 microns, and about 70% to 95% of the particles have a particle size of less than about 14.9 microns. In the most preferred embodiment, the silver powder has a particle distribution such that about 10% of the particles have a particle size of less than about 4.7 microns, about 50% of the particles have a particle size of less than about 7.6 microns, and about 90% of the particles have a particle size of less than about 14.9 microns.

According to the presently preferred embodiments, the silver flake is present in an amount of about 30% of the silver composition. Preferably the silver flake has a particle size range of about 5 microns to about 32 microns. The silver flake preferably has a flake distribution such that about 10% of the particles have a particle size of less than about 5.5 microns, about 50% of the particles have a particle size of less than about 12.5 microns, and about 90% of the particles have a particle size of less than about 32.0 microns.

In a further refinement of the presently preferred embodiment, an adhesion promoter is present in about 1 to 4% of the silver composition. This further refinement improves adhesion to substrates coated with transparent conductors such as indium tin oxide (ITO).

In accordance with another aspect of the invention, a photocurable silver composition suitable for producing a coating that is capable of shielding electromagnetic radiation is provided. This embodiment is preferably applied to a substrate by spraying. The silver composition comprises an acrylated epoxy oligomer, wherein the acrylated epoxy oligomer is present in an amount of about 2% to 8% of the silver composition. The silver composition preferably comprises an isobornyl acrylate monomer in an amount of about 15% to 30% of the silver composition, a photoinitiator in an amount of about 3% to 7% of the silver composition, a flow promoting agent in an amount of about 0.1% to 2% of the silver composition, a silver powder in an amount of about 20% to 40% of the silver composition, and a silver flake composition in an amount of about 20% to 40% of the silver composition.

In accordance with another aspect of the invention, a photocurable silver composition suitable for producing a coating that is capable of forming resistive links on circuit boards is provided. This embodiment of the invention preferably does not contain any urethane. The silver composition comprises an acrylated epoxy oligomer having, wherein the acrylated epoxy oligomer is present in an amount of about 16% to 20% of the silver composition. The silver composition also comprises an isobornyl acrylate monomer in an amount of about 8% to 14% of the silver composition, an photoinitiator in an amount of about 4% to 8% of the silver composition, a flow promoting agent in an amount of about 0.1% to 2% of the silver composition, a silver powder in an amount of about 25% to 38% of the silver composition, and a silver flake composition in an amount of about 20% to 40% of the silver composition.

In accordance with yet another aspect of the invention, a photocurable silver composition suitable for producing a coating that is capable resistive links on circuit boards is provided. This embodiment contains urethane. The silver composition comprises an aliphatic acrylated oligomer (a urethane), wherein the aliphatic acrylated oligomer is present in an amount of about 7% to 11% of the silver composition. The silver composition further comprises an acrylated epoxy oligomer, wherein the acrylated epoxy oligomer is present in an amount of about 1% to 4% of the silver composition. The silver composition also comprises an isobornyl acrylate monomer in an amount of about 12% to 25% of the silver composition, a photoinitiator in an amount of about 2% to 4% of the silver composition, a flow promoting agent in an amount of about 0.0% to 4% of the silver composition, an antimony tin oxide powder in an amount of 7% to 19%, a silver powder in an amount of about 24% to 30% of the silver composition, and a silver flake composition in an amount of about 15% to 30% of the silver composition. In a further refinement of this embodiment, the silver composition further comprises a polyacrylic oligomer/acrylate monomer blend in an amount of about 5% to 10%.

In accordance with yet another aspect of the invention, a photocurable silver composition suitable for producing a coating that is capable black colored resistive links on circuit boards is provided. The silver composition comprises an aliphatic acrylated oligomer, wherein the aliphatic acrylated oligomer is present in an amount of about 7% to 11% of the silver composition The silver composition further comprises an acrylated epoxy oligomer having, wherein the acrylated epoxy oligomer is present in an amount of about 2% to 4% of the silver composition. The silver composition also comprises an isobornyl acrylate monomer in an amount of about 10% to 14% of the silver composition, a photoinitiator in an amount of about 13% to 15% of the silver composition, a flow promoting agent in an amount of about 0.1% to 2% of the silver composition, a conductive carbon black powder in an amount of 5% to 12%, a wetting agent in an amount of about 0.5 to 3% of the silver composition, a silver powder in an amount of about 30% to 40% of the silver composition, and a silver flake composition in an amount of about 15% to 25% of the silver composition.

In accordance with another aspect of the invention, a method is provided for making a photocurable silver composition. The method comprises a first step of combining and mixing an isobornyl acrylate monomer and a photoinitiator to create a first mixture. The isobornyl acrylate monomer is present in an amount of about 4% to 8% of the silver composition, and the photoinitiator is present in an amount of about 3% to 6% of the silver composition.

The method includes a second step of combining and mixing an aliphatic acrylated oligomer and an acrylated epoxy oligomer to create a second mixture. The aliphatic acrylated oligomer is present in an amount of about 3% to 8% of the silver composition and the acrylated epoxy oligomer is present in an amount of about 2% to 4% of the silver composition.

The method includes a third step of combining and mixing a silver powder and a silver flake composition to create a third mixture. The silver powder is present in an amount of about 50% to 60% of the silver composition and the silver flake composition is present in an amount of about 25% to 35% of the silver composition.

The method further includes a fourth step of combining and mixing a flow promoting agent in an amount of about 0.1% to 2% of the silver composition, and a fifth step of combining the first, second, third and fourth mixtures to create the silver composition.

Preferably, but optionally, the first, second, third and fourth steps are performed sequentially. The method in its various forms may be carried out on a batch basis, for example, in a mixing vessel or similar process equipment suitable for batch processing. It may also be carried out in other forms, for example, such as continuous flow regimes.

In accordance with another aspect of the invention, another method is provided for making a photocurable silver composition. This method comprises a first step of combining and mixing an isobornyl acrylate monomer and a photoinitiator to create a first composition, wherein the isobornyl acrylate monomer is present in an amount of about 4% to 8% of the silver composition, and the photoinitiator is present in an amount of about 3% to 6% of the silver composition. This method also includes a second step of combining with the first composition and mixing an aliphatic acrylated oligomer and an acrylated epoxy oligomer to create a second mixture. The aliphatic acrylated oligomer is present in an amount of about 3% to 8% of the silver composition and the acrylated epoxy oligomer is present in an amount of about 2% to 4% of the silver composition.

The method further includes a third step of combining with the second composition and mixing a silver powder and a silver flake composition to create a third composition. The silver powder is present in an amount of about 50% to 60% of the silver composition and the silver flake composition is present in an amount of about 25% to 35% of the silver composition.

The method still further includes a fourth step of combining with the third composition and mixing a flow promoting agent in an amount of about 0.1% to 2% of the silver composition.

This method also may be carried out in a batch format, for example, in a mixing vessel or series of mixing vessels, in a continuous flow regime, or in some combination.

In accordance with yet another aspect of the invention, a method is provided for depositing a silver coating on a substrate. The method comprises a first step of applying to the substrate a silver-containing fluid-phase composition ("silver composition"). The silver composition comprises an aliphatic acrylated oligomer, wherein the aliphatic acrylated oligomer is present in an amount of about 3% to 8% of the silver composition. The silver composition further includes an acrylated epoxy oligomer. The acrylated epoxy oligomer is present in an amount of about 2% to 4% of the silver composition. The silver composition also includes an isobornyl acrylate monomer in an amount of about 4% to 8% of the silver composition, a photoinitiator in an amount of about 3% to 6% of the silver composition, and a flow promoting agent in an amount of about 0.1% to 2% of the silver composition. The silver composition further includes a silver powder in an amount of about 50% to 60% of the silver composition, and a silver flake composition in an amount of about 25% to 35% of the silver composition.

The method also includes a second step of illuminating the silver composition on the substrate with light of a wavelength suitable to cause the silver composition to cure into the silver coating. Preferably light will have a wavelength in the ultraviolet region of the electromagnetic spectrum.

In accordance with this method, the silver composition can be selectively deposited on the substrate at specific locations where silver plating is desired. It need not be applied to the entire substrate. It is thus possible, for example, to use the silver coating thus created as metalizations on semiconductor wafers, printed circuit boards, pressure sensitive or pressure activated switches, and the like.

According to another aspect of the invention, a method is provided for preparing a liquid-phase silver-containing composition for use in providing a silver-containing coating or plating on a substrate. The presently preferred version of the method includes preparing the composition as identified immediately above. The method in broad terms includes a first step of combining and mixing the monomer and the photoinitiator in a mixing vessel, a second step of adding to the mixing vessel and blending in the urethane and the epoxy, a third step of adding to the mixing vessel and blending in the silver powder and the silver flake, and a forth step of adding to the mixing vessel and blending in the flow agent.

BEST MODE FOR CARRYING OUT THE INVENTION

Silver Compositions

Reference will now be made in detail to presently preferred compositions or embodiments and methods of the invention, which constitute the best modes of practicing the invention presently known to the inventor.

In accordance with one aspect of the invention, a presently preferred photocurable silver composition ("silver composition") is provided. In this preferred embodiment, the silver composition includes an aliphatic acrylated oligomer. The aliphatic acrylated oligomer is present in an amount of about 3% to 8%, and preferably about 8%, of the silver composition. The aliphatic acrylated oligomer preferably comprises a urethane oligomer. Suitable aliphatic acrylated oligomers include Radcure Ebecryl 244, Ebecryl 264 and Ebecryl 284 urethanes, commercially available from Radcure UCB Corp. of Smyrna, Ga.; Sartomer CN961, CN963, CN964, CN 966, CN982 and CN 983, commercially available from Sartomer Corp. of Exton, Pa.; TAB FAIRAD 8010, 8179, 8205, 8210, 8216, 8264, M-E-15, UVU-316, commercially available from TAB Chemicals of Chicago, Ill.; and Echo Resin ALU-303, commercially available from Echo Resins of Versaille, Mo.; and Genomer 4652, commercially available from Rahn Radiation Curing of Aurora, Ill. The preferred aliphatic acrylated oligomers include Ebecryl 264 and Ebecryl 284. Ebecryl 264 is an aliphatic urethane triacrylate supplied as an 85% solution in hexandiol diacrylate. Ebecryl 284 is aliphatic urethane diacrylate of 1200 molecular weight diluted with 1,6-hexanediol diacrylate. It is obvious to one skilled in the art that combinations of these materials may also be employed herein.

This preferred silver composition further includes an acrylated epoxy oligomer. The acrylated epoxy oligomer is present in an amount of about 2% to 4%, and preferably about 3%, of the silver composition. Suitable acrylated epoxy oligomers include Radcure Ebecryl 3603, commercially available from Radcure UCB Corp.; Sartomer CN120 and CN124, commercially available from Sartomer Corp.; and Echo Resin TME 9310 and 9345, commercially available from Echo Resins. The preferred acrylated epoxy oligomer is Ebecryl 3603, which tri-functional acrylated epoxy novolac. Combinations of these materials may also be employed herein.

The preferred silver composition also includes an isobornyl acrylate monomer in an amount of about 4% to 8%, and preferably about 5%, of the silver composition. Suitable isobornyl acrylate monomers include Sartomer SR423 IBOMA and SR506 IBOA; Radcure IBOA, commercially available from Radcure Corp.; IBOA and IBOMA, commercially available from CPS Chemical; and Genomer 1121, commercially available from Rahn Radiation Curing. Preferred isobornyl acrylate monomers include Sartomer SR423 IBOMA and SR506 IBOA; Radcure IBOA, commercially available from Radcure Corp.; IBOA AND IBOMA, commercially available from CPS Chemical; and Genomer 1121, commercially available from Rahn Radiation Curing.

This preferred silver composition also includes a photoinitiator in an amount of about 3% to 6%, and preferably about 4%, of the silver composition. Suitable photoinitiators include Irgacure 184 (1-hydroxycyclohexyl phenyl ketone), 907 (2-methyl-1-[4-(methylthio)phenyl]-2-morpholino propan-1-one), 369 (2-benzyl-2-N,N-dimethylamino-1-(4-morpholinophenyl)-1-butanone), 500 (the combination of 1-hydroxy cyclohexyl phenyl ketone and benzophenone), 651 (2,2-dimethoxy-2-phenyl acetophenone), 1700 (the combination of bis(2,6-dimethoxybenzoyl-2,4-,4-trimethyl pentyl phosphine oxide and 2-hydroxy-2-methyl-1-phenyl-propan-1-one), Ciba-Geigy 1700, and DAROCUR 1173 (2-hydroxy-2-methyl-1phenyl-1-propane) and 4265 (the combination of 2,4,6-trimethylbenzoyldiphenyl-phosphine oxide and 2-hydroxy-2-methyl-1-phenyl-propan-1-one), available commercially from Ciba-Geigy Corp., Tarrytown, N.Y.; CYRACURE UVI-6974 (mixed triaryl sulfonium hexafluoroantimonate salts) and UVI-6990 (mixed triaryl sulfonium hexafluorophosphate salts) available commercially from Union Carbide Chemicals and Plastics Co. Inc., Danbury, Conn.; and Genocure CQ, Genocure BOK, and GenocureMBF, commercially available from Rahn Radiation Curing. The preferred photoinitiator is Irgacure 1700 commercially available from Ciba-Geigy of Tarrytown, N.Y.

The preferred silver composition still further includes a flow promoting agent in an amount of about 0.1% to 2%, and preferably about 1.0%, of the silver composition. Suitable flow promoting agents include Genorad 17, commercially available from Rahn Radiation Curing; and Modaflow, commercially available from Monsanto Chemical Co., St. Louis, Mo. The preferred flow promoting agent is Modaflow which is an ethyl acrylate and 2-ethylhexyl acrylate copolymer that improves the flow of the composition. Combinations of these materials may also be employed herein.

The preferred silver composition also includes a silver powder in an amount of about 50% to 60%, and preferably about 52%, of the silver composition. The silver powder comprises a plurality of particles. In this preferred silver composition, the silver powder has a particle size range for these particles of about 5 microns to about 15 microns. In some embodiments, the silver powder has a particle size range of about 4.7 microns to about 14.9 microns. Preferably, the silver powder particles have a particle size distribution wherein about 10% of the particles have a particle size of less than about 4.7 microns, about 50% of the particles have a particle size of less than about 7.6 microns, and about 90% of the particles have a particle size of less than about 14.9 microns. The preferred silver powders are Silver Powder EG-ED and Silver Powder C-ED commercially available from Degussa Corp. of South Plainfield, N.J.

The preferred silver composition further includes a silver flake composition in an amount of about 25% to 35%, and preferably about 30%, of the silver composition. The silver flake composition comprises a plurality of flakes which comprise, and which preferably consist essentially of, silver. The silver flake composition according to this embodiment has a particle size range of about 5 microns to about 32 microns. More preferably, the silver flake composition has a particle size range of about 5.5 microns to about 32.0 microns. The silver flake particle size distribution preferably is such that about 10% of the particles have a particle size of less than about 5.5 microns, about 50% of the particles have a particle size of less than about 12.5 microns, and about 90% of the particles have a particle size of less than about 32.0 microns. The preferred silver flake compositions are Silver Flake #25, Silver Flake #1, and Silver Flake #7A commercially available from Degussa Corp. of South Plainfield, N.J.

EXAMPLE 1

This example provides a preferred silver composition according to the invention that can be used for deposition on the surface of a substrate such as a polymeric membrane, for example, to serve as the electrical contact for a pressure-sensitive switch. The silver composition was made from the following components:

| Component | Approximate Mass % |
|---|---|
| Ebecryl 264 | 7.2 |
| Ebecryl 3603 | 2.4 |
| IBOA | 4.7 |

-continued

| Component | Approximate Mass % |
|---|---|
| Silver Powder EGED | 53.4 |
| Silver Flake #25 | 27.6 |
| Iragure 1700 | 3.9 |
| Modaflow | 0.8 |
| Total | 100.00 |

In this example the IBOA and Iragure 1700 are mixed in a pan with a propeller blade mixer for 30 seconds at a speed of 500 to 1000 rpm. Next, the Ebecryl 264, the Ebecryl 3603, and the Modaflow are introduced into the pan and mixed for 1 to 2 minutes at a speed of 1000 rpm. In the next step, the EGED silver powder, and the Silver Flake #25 are introduced into the pan and are mixed for 1 to 2 minutes at a speed of 1000 rpm. Finally, the mixing speed is increased to 10,000 rpm and mixed for an additional 5 minutes.

For best results, the silver powder is washed prior to addition to the mixture. The washing process includes a first step of loading the powder in a sealable container. A mixture consisting of 17% methyl ethyl ketone and 83% silver composition is added to the container and the slurry is mixed with a propeller blade for 5 minutes at 500 rpm. The methyl ethyl ketone is poured off and the silver powder is allowed to air dry. During the drying stage the powder is periodically mixed.

The silver powder according to the presently-preferred composition comprises EGED, commercially available from Degussa Corp. of South Plainfield, N.J. Such silver also may be obtained from other commercial sources, e.g., such as Englehard Chemical Co. of Iselin, N.J. The presently preferred silver powder has a grain size distribution ranging from about 5 microns to about 15 microns. This presently preferred silver powder has a particle size distribution as follows:

TABLE 1

Silver Powder Particle Size Distribution

| Size Range (microns) | Percentage |
|---|---|
| <4.7 | 10% |
| <7.6 | 50% |
| <14.9 | 90% |

As this table indicates, within a sample of the silver powder, 10% of the grains have a size of less than 4.7 microns, 50% of the grains have a particle size of less than 7.6 microns, and 90% of the grains have a particle size of less than 14.9 microns.

The silver flake according to the presently-preferred composition of Example I comprises SF25, commercially available from Degussa. This silver flake composition preferably has a grain size distribution ranging from about 5 microns to about 32 microns. It has a particle size distribution as follows:

TABLE 2

Silver Flake Composition Particle Size Distribution

| Size Range (microns) | Percentage |
|---|---|
| <5.5 | 10% |
| <12.5 | 50% |
| <32.0 | 90% |

As indicated in Table 2, within a sample of the silver flake, 10% of the flakes have a size of less than 5.5 microns, 50% of the flakes have a particle size of less than 12.5 microns, and 90% of the flakes have a particle size of less than 32.0 microns.

EXAMPLE 2

This example provides another preferred silver composition according to the invention that can be used for deposition on the surface of a substrate such as those noted above. The silver composition was made from the following components:

| Component | Approximate Mass % |
|---|---|
| Ebecryl 264 | 4.2 |
| Ebecryl 3603 | 2.7 |
| IBOA | 7.7 |
| Silver Powder EGED | 53.4 |
| Silver Flake #25 | 27.6 |
| Iragure 1700 | 3.8 |
| Modaflow | 0.6 |
| Total | 100.00 |

In this example the IBOA and Iragure 1700 are mixed in a pan with a propeller blade mixer for 30 seconds at a speed of 500 to 1000 rpm. Next, the Ebecryl 264, the Ebecryl 3603, and the Modaflow are introduced into the pan and mixed for 1 to 2 minutes at a speed of 1000 rpm. In the next step, the EGED silver powder, and the Silver Flake #25 are introduced into the pan and are mixed for 1 to 2 minutes at a speed of 1000 rpm. Finally, the mixing speed is increased to 10,000 rpm and mixed for an additional 5 minutes.

EXAMPLE 3

This example provides another preferred silver composition according to the invention that can be used for deposition on the surface of a substrate coated with indium tin oxide (ITO). The silver composition was made from the following components:

| Component | Approximate Mass % |
|---|---|
| Ebecryl 264 | 7.0 |
| Ebecryl 3603 | 2.3 |
| IBOA | 4.6 |
| Silver Powder EGED | 52.3 |
| Silver Flake #25 | 27.0 |
| Iragure 1700 | 3.8 |
| Modaflow | 0.8 |
| Ebecryl 168 | 2.2 |
| Total | 100.00 |

In this example the IBOA and Iragure 1700 are mixed in a pan with a propeller blade mixer for 30 seconds at a speed of 500 to 1000 rpm. Next, the Ebecryl 264, the Ebecryl 3603, and the Modaflow are introduced into the pan and mixed for 1 to 2 minutes at a speed of 1000 rpm. In the next step, the EGED silver powder, and the Silver Flake #25 are introduced into the pan and are mixed for 1 to 2 minutes at a speed of 1000 rpm. In the next step, the Ebecryl 168 is added into the pan and the combination mixed at 1000 rpm for 1 to 2 minutes. Finally, the mixing speed is increased to 10,000 rpm and mixed for an additional 5 minutes.

This example contains Ebecryl 168 added as an adhesion promoter. This material is a methacrylate ester derivative commercially available from Radcure UCB Corp. of Smyrna, Ga.

Silver Composition for Producing a Coating Capable of Shielding Electromagnetic Interference In accordance with another aspect of the invention, a presently preferred photocurable silver composition ("silver composition") is provided. This composition upon photocuring produces a coating capable of shielding electromagnet interference. Such a coating may be applied to substrates requiring shielding from electromagnetic interferences such as the interior of radio casings. In this preferred embodiment, the silver composition includes an acrylated epoxy oligomer. The acrylated epoxy oligomer is present in an amount of about 2% to 8%, and preferably about 5%, of the silver composition. Suitable acrylated epoxy oligomers are the same as listed above. The preferred acrylated epoxy oligomer is Ebecryl 3603, which tri-functional acrylated epoxy novolac. Combinations of these materials may also be employed herein.

The preferred silver composition also includes an isobornyl acrylate monomer in an amount of about 15% to 30%, and preferably about 21%, of the silver composition. Suitable isobornyl acrylate monomers are the same as listed above. Preferred isobornyl acrylate monomers include Sartomer SR423 IBOMA and SR506 IBOA; Radcure IBOA, commercially available from Radcure Corp.; IBOA and IBOMA, commercially available from CPS Chemical; and Genomer 1121, commercially available from Rahn Radiation Curing. Combinations of these materials may also be employed herein.

This preferred silver composition also includes a photoinitiator in an amount of about 3% to 7%, and preferably about 5%, of the silver composition. Suitable photoinitiators are the same as listed above. The preferred photoinitiator is Irgacure 1700 commercially available from Ciba-Geigy of Tarrytown, N.Y.. Combinations of these materials may also be employed herein.

The preferred silver composition still further includes a flow promoting agent in an amount of about 0.1% to 2%, and preferably about 1.0%, of the silver composition. Suitable flow promoting agents are the same as listed above. The preferred flow promoting agent is Modaflow which is an ethyl acrylate and 2-ethylhexyl acrylate copolymer that improves the flow of the composition. Combinations of these materials may also be employed herein.

The preferred silver composition also includes a silver powder in an amount of about 25% to 40%, and preferably about 36%, of the silver composition. The preferred silver powders are Silver Powder EG-ED and Silver Powder C-ED commercially available from Degussa Corp. of South Plainfield, N.J.

The preferred silver composition further includes a silver flake composition in an amount of about 20% to 40%, and preferably about 30%, of the silver composition. The preferred silver flake compositions are Silver Flake #25, Silver Flake #1, and Silver Flake #7A commercially available from Degussa Corp. of South Plainfield, N.J.

EXAMPLE 4

This example provides another preferred silver composition according to the invention that when applied to a surface and subsequently cured by ultraviolet radiation will produce a coating suitable for shielding electromagnetic interference. The silver composition was made from the following components:

| Component | Approximate Mass % |
| --- | --- |
| Ebecryl 3603 | 5.3 |
| IBOA | 21.0 |
| Silver Powder EGED | 31.5 |
| Silver Flake #1 | 35.7 |
| Iragure 1700 | 5.3 |
| Modaflow | 1.2 |
| Total | 100.00 |

In this example the IBOA and Iragure 1700 are mixed in a pan with a propeller blade mixer for 30 seconds at a speed of 500 to 1000 rpm. Next, the Ebecryl 3603, and the Modaflow are introduced into the pan and mixed for 5 minutes at a speed of 5000 rpm. In the next step, the EGED silver powder and the Silver Flake #1 are introduced into the pan and are mixed for 1 to 2 minutes at a speed of 1000 rpm. Finally, the mixing speed is increased to 10,000 rpm and mixed for an additional 5 to 10 minutes.

Non-Urethane Containing Silver Composition for Producing Resistive Links

In accordance with another aspect of the invention, a presently preferred photocurable silver composition ("silver composition") is provided. This composition upon photocuring produces a coating capable of producing resistive links in circuit boards. In this preferred embodiment, the silver composition includes an acrylated epoxy oligomer. The acrylated epoxy oligomer is present in an amount of about 16% to 20%, and preferably about 18%, of the silver composition. Suitable acrylated epoxy oligomers are the same as listed above. The preferred acrylated epoxy oligomer is Ebecryl 3603, which tri-functional acrylated epoxy novolac. Combinations of these materials may also be employed herein.

The preferred silver composition also includes an isobornyl acrylate monomer in an amount of about 8% to 14%, and preferably about 11%, of the silver composition. Suitable isobornyl acrylate monomers are the same as listed above. Preferred isobornyl acrylate monomers include Sartomer SR423 IBOMA and SR506 IBOA; Radcure IBOA, commercially available from Radcure Corp.; IBOA AND IBOMA, commercially available from CPS Chemical; and Genomer 1121, commercially available from Rahn Radiation Curing. Combinations of these materials may also be employed herein.

This preferred silver composition also includes a photoinitiator in an amount of about 4% to 8%, and preferably about 6%, of the silver composition. Suitable photoinitiators are the same as those listed above. The preferred photoinitiator is Irgacure 1700 commercially available from Ciba-Geigy of Tarrytown, N.Y. Combinations of these materials may also be employed herein.

The preferred silver composition still further includes a flow promoting agent in an amount of about 0.1% to 2%, and preferably about 1.0%, of the silver composition. Suitable flow promoting agents are the same as those listed above. The preferred flow promoting agent is Modaflow which is an ethyl acrylate and 2-ethylhexyl acrylate copolymer that improves the flow of the composition. Combinations of these materials may also be employed herein.

The preferred silver composition also includes a silver powder in an amount of about 25% to 35%, and preferably about 30%, of the silver composition. The preferred silver powders are Silver Powder EG-ED and Silver Powder C-ED commercially available from Degussa Corp. of South Plainfield, N.J.

The preferred silver composition further includes a silver flake composition in an amount of about 25% to 38%, and preferably about 34%, of the silver composition. The preferred silver flake compositions are Silver Flake #25, Silver Flake #1, and Silver Flake #7A commercially available from Degussa Corp. of South Plainfield, N.J.

To illustrate, the following example sets forth a presently preferred silver composition according to this aspect of the invention.

EXAMPLE 5

This example provides another preferred silver composition according to the invention that when applied to a surface and subsequently cured by ultraviolet radiation will produce a coating suitable for making resistive links on circuit board. The silver composition was made from the following components:

| Component | Approximate Mass % |
| --- | --- |
| Ebecryl 3603 | 18.3 |
| IBOA | 11.1 |
| Silver Powder EGED | 30.0 |
| Silver Flake #1 | 33.5 |
| Iragure 1700 | 6.1 |
| Modaflow | 1.0 |
| Total | 100.00 |

In this example the IBOA and Iragure 1700 are mixed in a pan with a propeller blade mixer for 30 seconds at a speed of 500 to 1000 rpm. Next, the Ebecryl 3603 and the Modaflow are introduced into the pan and mixed for 5 minutes at a speed of 5000 rpm. In the next step, the EGED silver powder and the Silver Flake #1 are introduced into the pan and are mixed for 1 to 2 minutes at a speed of 1000 rpm. Finally, the mixing speed is increased to 10,000 rpm and mixed for an additional 5 to 10 minutes.

Urethane Containing Silver Composition for Producing Resistive Links

In accordance with one aspect of the invention, a presently preferred photocurable silver composition ("silver composition") is provided. This composition upon photocuring produces a coating capable of producing resistive links in circuit boards. In this preferred embodiment, the silver composition includes an aliphatic acrylated oligomer. The aliphatic acrylated oligomer is present in an amount of about 7% to 11%, and preferably about 9%, of the silver composition. The aliphatic acrylated oligomer preferably comprises a urethane oligomer. Suitable aliphatic acrylated oligomers are the same as those listed above. The preferred aliphatic acrylated oligomers include Ebecryl 264 and Ebecryl 284. Ebecryl 264 is an aliphatic urethane triacrylate supplied as an 85% solution in hexandiol diacrylate. Ebecryl 284 is aliphatic urethane diacrylate of 1200 molecular weight diluted with 1,6-hexandiol diacrylate. Combinations of these materials may also be employed herein.

This preferred silver composition further includes an acrylated epoxy oligomer. The acrylated epoxy oligomer is present in an amount of about 1% to 4%, and preferably about 3%, of the silver composition. Suitable acrylated epoxy oligomers are the same as those listed above. The preferred acrylated epoxy oligomer is Ebecryl 3603, which tri-functional acrylated epoxy novolac. Combinations of these materials may also be employed herein.

The preferred silver composition also includes an isobornyl acrylate monomer in an amount of about 12% to 25%, and preferably about 22%, of the silver composition. Preferred isobornyl acrylate monomers include Sartomer SR423 IBOMA and SR506 IBOA; Radcure IBOA, commercially available from Radcure Corp.; IBOA and IBOMA, commercially available from CPS Chemical; and Genomer 1121, commercially available from Rahn Radiation Curing. Combinations of these materials may also be employed herein.

This preferred silver composition also includes a photoinitiator in an amount of about 2% to 4%, and preferably about 3%, of the silver composition. Suitable photoinitiators are the same as those listed above. The preferred photoinitiator is Irgacure 1700 commercially available from Ciba-Geigy of Tarrytown, N.Y.

The preferred silver composition further includes a antimony tin oxide powder in an amount of 7% to 19%, and preferable about 17% of the silver composition. The preferred antimony tin oxide powder in Minatec 40 commercially available from EM Industries of Hawthorne, N.Y..

The preferred silver composition still further includes a flow promoting agent in an amount of about 0.0% to 4%, and preferably about 2.0%, of the silver composition. Suitable flow promoting agents are the same as those listed above. The preferred flow promoting agent is Modaflow which is an ethyl acrylate and 2-ethylhexyl acrylate copolymer that improves the flow of the composition.

The preferred silver composition also includes a silver powder in an amount of about 24% to 30%, and preferably about 27%, of the silver composition. The preferred silver powders are Silver Powder EG-ED and Silver Powder C-ED commercially available from Degussa Corp. of South Plainfield, N.J.

The preferred silver composition further includes a silver flake composition in an amount of about 15% to 30%, and preferably about 17%, of the silver composition. The preferred silver flake compositions are Silver Flake #25, Silver Flake #1, and Silver Flake #7A commercially available from Degussa Corp. of South Plainfield, N.J.

EXAMPLE 6

This example provides another preferred silver composition according to the invention that when applied to a surface and subsequently cured by ultraviolet radiation will produce a coating suitable for making resistive links on circuit board. The silver composition was made from the following components:

| Component | Approximate Mass % |
|---|---|
| Ebecryl 264 | 8.7 |
| Ebecryl 3603 | 2.9 |
| IBOA | 22.4 |
| Silver Flake #7A | 17.0 |
| Silver Powder CED | 26.5 |
| Minatec 40 | 17.2 |

-continued

| Component | Approximate Mass % |
|---|---|
| Iragure 1700 | 3.3 |
| Modaflow | 2.0 |
| Total | 100.00 |

In this example the IBOA and Iragure 1700 are mixed in a pan with a propeller blade mixer for 30 seconds at a speed of 500 to 1000 rpm. Next, the Ebecryl 264, the Ebecryl 3603, and the Modaflow are introduced into the pan and mixed for 1 to 2 minutes at a speed of 1000 rpm. In the next step, the CED silver powder, the Minatec 40, and the Silver Flake #7A are introduced into the pan and are mixed for 1 to 2 minutes at a speed of 1000 rpm. Finally, the mixing speed is increased to 10,000 rpm and mixed for an additional 5 minutes.

EXAMPLE 7

This example provides another preferred silver composition according to the invention that when applied to a surface and subsequently cured by ultraviolet radiation will produce a coating suitable for making resistive links on circuit board. The silver composition was made from the following components:

| Component | Approximate Mass % |
|---|---|
| Ebecryl 284 | 8.4 |
| Ebecryl 3603 | 1.7 |
| Ebecryl 754 | 8.4 |
| IBOA | 15.7 |
| Silver Powder CED | 25.0 |
| Silver Flake #7A | 28.5 |
| Iragure 1700 | 2.5 |
| Minatec 40 | 9.8 |
| Total | 100.00 |

In this example the IBOA and Iragure 1700 are mixed in a pan with a propeller blade mixer for 30 seconds at a speed of 500 to 1000 rpm. Next, the Ebecryl 754, Ebecryl 284, the Ebecryl 3603, and the Modaflow are introduced into the pan and mixed for 1 to 2 minutes at a speed of 1000 rpm. In the next step, the CED silver powder, and the Silver Flake #7A are introduced into the pan and are mixed for 1 to 2 minutes at a speed of 1000 rpm. Finally, the mixing speed is increased to 10,000 rpm and mixed for an additional 5 minutes.

This example contains Ebecryl 754 as an additive. Ebecryl 754 is a polyacrylic oligomer/acrylate monomer blend commercially available from Radcure UCB Corp. of Smyrna, Ga.

Black Colored Silver Composition for Producing Resistive Links

In accordance with one aspect of the invention, a presently preferred photocurable silver composition ("silver composition") is provided. This composition upon photocuring produces a dark-colored coating capable of producing resistive links in circuit boards. In this preferred embodiment, the silver composition includes an aliphatic acrylated oligomer. The aliphatic acrylated oligomer is present in an amount of about 7% to 11%, and preferably about 9%, of the silver composition. The aliphatic acrylated oligomer preferably comprises a urethane oligomer. Suitable aliphatic acrylated oligomers are the same as those listed above. The preferred aliphatic acrylated oligomers include Ebecryl 264 and Ebecryl 284. Ebecryl 264 is an aliphatic urethane triacrylate supplied as an 85% solution in hexandiol diacrylate. Ebecryl 284 is aliphatic urethane diacrylate of 1200 molecular weight diluted with 1,6-hexandiol diacrylate. Combinations of these materials may also be employed herein.

This preferred silver composition further includes an acrylated epoxy oligomer. The acrylated epoxy oligomer is present in an amount of about 2% to 4%, and preferably about 3%, of the silver composition. Suitable acrylated epoxy oligomers are the same as those listed above. The preferred acrylated epoxy oligomer is Ebecryl 3603, which tri-functional acrylated epoxy novolac.

The preferred silver composition also includes an isobornyl acrylate monomer in an amount of about 10% to 14%, and preferably about 12%, of the silver composition. Preferred isobornyl acrylate monomers include Sartomer SR423 IBOMA and SR506 IBOA; Radcure IBOA, commercially available from Radcure Corp.; IBOA AND IBOMA, commercially available from CPS Chemical; and Genomer 1121, commercially available from Rahn Radiation Curing.

This preferred silver composition also includes a photoinitiator in an amount of about 13% to 15%, and preferably about 14%, of the silver composition. The preferred photoinitiator is Irgacure 1700 commercially available from Ciba-Geigy of Tarrytown, N.Y.

The preferred silver composition further includes a carbon black powder in an amount of 5% to 12%, and preferable about 7% of the silver composition. The preferred carbon black powder is Printex L commercially available from EM Industries of Hawthorne, N.Y.

The preferred silver composition further includes a wetting agent in an amount of 0.5% to 3%, and preferable about 1.5% of the silver composition. The preferred wetting agent is BYK 207 L commercially available from Byk-Chemie of Wallingford, Conn.

The preferred silver composition still further includes a flow promoting agent in an amount of about 0.1% to 2%, and preferably about 1.0%, of the silver composition. The preferred flow promoting agent is Modaflow which is an ethyl acrylate and 2-ethylhexyl acrylate copolymer that improves the flow of the composition. It is obvious to one skilled in the art that combinations of these materials may also be employed herein.

The preferred silver composition also includes a silver powder in an amount of about 30% to 40%, and preferably about 36%, of the silver composition. The preferred silver powders are Silver Powder EG-ED and Silver Powder C-ED commercially available from Degussa Corp. of South Plainfield, N.J.

The preferred silver composition further includes a silver flake composition in an amount of about 15% to 25%, and preferably about 18%, of the silver composition. The preferred silver flake compositions are Silver Flake #25, Silver Flake #1, and Silver Flake #7A commercially available from Degussa Corp. of South Plainfield, N.J.

EXAMPLE 8

This example provides another preferred silver composition according to the invention that when applied to a surface and subsequently cured by ultraviolet radiation will produce a coating suitable for making black colored resistive links on circuit board. The silver composition was made from the following components:

| Component | Approximate Mass % |
|---|---|
| Ebecryl 264 | 8.8 |
| Ebecryl 3603 | 2.5 |
| Printex L | 7.3 |
| Byk 207 | 1.5 |
| IBOA | 11.6 |
| Silver Powder EGED | 35.7 |
| Silver Flake #25 | 18.4 |
| Iragure 1700 | 13.5 |
| Modaflow | 0.7 |
| Total | 100.00 |

In this example the IBOA and Iragure 1700 are mixed in a pan with a propeller blade mixer for 30 seconds at a speed of 500 to 1000 rpm. Next, the Ebecryl 264, the Ebecryl 3603, and the Modaflow are introduced into the pan and mixed for 1 to 2 minutes at a speed of 1000 rpm. In the next step, the EGED silver powder, the Silver Flake #25, and the Printex L are introduced into the pan and are mixed for 1 to 2 minutes at a speed of 1000 rpm. Finally, the BYK 207 in introduced and mixed for 5 minutes at a speed of 10,000 rpm.

In describing each of the components in these examples and in this description, the compositions have been described as "comprising" the stated component. Preferably each of those components consists essentially of, and more preferably they consist exclusively of, the stated components, and from the stated sources.

The silver-containing composition as described above is referred to as being a "fluid phase" composition. This is meant to indicate that the composition is flowable as is a liquid, but is not otherwise limiting. Preferably, the silver composition comprises a liquid. The composition, for example, generally will be a slurry, in which the silver metal grains (powder and flakes) are solid-phase particles suspended in the liquid phase or phases of the urethane, epoxy, and any other liquid or essentially liquid components.

Method for Preparing Silver Composition

In accordance with another aspect of the invention, a method is provided for making a photocurable silver composition. In accordance with a preferred version, the method includes a first step of combining and mixing an isobornyl acrylate monomer and a photoinitiators to create a first mixture. The isobornyl acrylate monomer is present in an amount of about 4% to 8% of the silver composition, and the photoinitiator is present in an amount of about 4% to 6% of the silver composition.

This preferred method preferably but optionally is carried out using a mixing vessel of appropriate size, depending upon the desired batch size. A glass or steel lined batch processing vessel of known design and commercial availability typically will suffice.

This first step of the preferred method is carried out by placing the components into the vessel while stirring, e.g., by a suitable impeller.

The method includes a second step of combining and mixing an aliphatic acrylated oligomer and an acrylated epoxy oligomer to create a second mixture. The aliphatic acrylated oligomer is present in an amount of about 3% to 8% of the silver composition and the acrylated epoxy oligomer is present in an amount of about 2% to 4% of the silver composition. In accordance with this preferred method, this second step is carried out sequentially after the first step, and involves blending in these components into the first mixture, i.e., from the first step.

The method further includes a third step of combining and mixing a silver powder and a silver flake composition to create a third mixture. The silver powder is present in an amount of about 50% to 60% of the silver composition and the silver flake composition is present An amount of about 25% to 35% of the silver composition. This step also preferably is carried out in the vessel, preferably sequentially after completion of the second step.

The method further includes a fourth step of combining and mixing a flow promoting agent in an amount of about 0.1% to 2% of the silver composition, and a fifth step of combining the first, second, third and fourth mixtures to create the silver composition.

These steps also preferably would be performed sequentially by adding the cited components into the vessel while mixing with the impeller.

As noted, preferably but optionally, the first, second, third and fourth steps are performed sequentially. This is not, however, limiting. Different processing orders may be used in accordance with the method.

Also as noted, the method in its various forms may be carried out on a batch basis, for example, in a mixing vessel or similar process equipment suitable for batch processing. It may also be carried out in other forms, for example, such as continuous flow regimes, e.g., using known continuous flow processing equipment and configurations for mixing these components, preferably but optionally in the sequential order identified above.

In accordance with another aspect of the invention, another method is provided for making an ultraviolet curable silver composition. This method comprises a first step of combining and mixing an isobornyl acrylate monomer and a photoinitiator to create a first composition, wherein the isobornyl acrylate monomer is present in an amount of about 4% to 8% of the silver composition, and the photoinitiator is present in an amount of about 3% to 6% of the silver composition. This method also includes a second step of combining with the first composition and mixing an aliphatic acrylated oligomer and an acrylated epoxy oligomer to create a second mixture. The aliphatic acrylated oligomer is present in an amount of about 3% to 8% of the silver composition and the acrylated epoxy oligomer is present in an amount of about 2% to 4% of the silver composition.

The method further includes a third step of combining with the second composition and mixing a silver powder and a silver flake composition to create a third composition. The silver powder is present in an amount of about 50% to 60% of the silver composition and the silver flake composition is present in an amount of about 25% to 35% of the silver composition.

The method still further includes a fourth step of combining with the third composition and mixing a flow promoting agent in an amount of about 0.1% to 2% of the silver composition.

According to another aspect of the invention, a method is provided for preparing a liquid-phase silver-containing composition for use in providing a silver-containing coating, plating, film or layer on a substrate. The presently-preferred version of the method includes preparing either of the preferred silver compositions as identified in the examples above. The preferred version of this method includes a first step of combining and mixing the monomer and the photoinitiator in a mixing vessel. The method includes a second step of adding to the mixing vessel and blending into the previously-added components the urethane and the epoxy. The method also includes a third step of adding to the mixing vessel and blending into the components therein the silver powder and the silver flake. The preferred method further includes a fourth step of adding to the mixing vessel and blending into its previously-added components the flow agent.

Method for Depositing a Silver Coating on a Substrate

In accordance with still another aspect of the invention, a method is provided for depositing a silver coating on a substrate. The method comprises a first step of applying a silver-containing fluid-phase composition ("silver composition") to the substrate.

The silver composition comprises an aliphatic acrylated oligomer, the aliphatic acrylated oligomer being present in an amount of about 3% to 8% of the silver composition; an acrylated epoxy oligomer, the acrylated epoxy oligomer being present in an amount of about 2% to 4% of the silver composition; an isobornyl acrylate monomer in an amount of about 4% to 8% of the silver composition; a photoinitiator in an amount of about 3% to 6% of the silver composition; a flow promoting agent in an amount of about 0.1% to 2% of the silver composition; a silver powder in an amount of about 50% to 60% of the silver composition; and a silver flake composition in an amount of about 25% to 35% of the silver composition. The preferred silver compositions according to this method are those described herein, for example, including the compositions described in the examples.

The silver composition may be applied to the substrate using a number of different techniques. The silver composition may be applied, for example, by direct brush application, or it may be sprayed onto the substrate surface. It also may be applied using a screen printing technique. In such screen printing technique, a "screen" as the term is used in the screen printing industry is used to regulate the flow of liquid composition onto the substrate surface. The silver composition typically would be applied to the screen as the latter contacts the substrate. The silver composition flows through the silk screen to the substrate, whereupon it adheres to the substrate An the desired film thickness. Screen printing techniques suitable for this purpose include known techniques, but wherein the process is adjusted in ways known to persons of ordinary skill in the art to accommodate the viscosity, flowability, and other properties of the liquid-phase composition, the substrate and its surface properties, etc. Flexographic techniques, for example, using pinch rollers to contact the silver composition with a rolling substrate, also may be used.

The method includes a second step of illuminating the silver-containing fluid-phase composition on the substrate with an ultraviolet light to cause the silver-containing fluid-phase composition to cure into the silver coating. This illumination may be carried out in any number of ways, provided the ultraviolet light or radiation impinges upon the silver composition so that the silver composition is caused to polymerize to form the coating, layer, film, etc., and thereby cures.

Curing preferably takes place by free radical polymerization, which is initiated by an ultraviolet radiation source. The photoinitiator preferably comprises a photoinitiator, as described above.

Various ultraviolet light sources may be used, depending on the application. Preferred ultraviolet radiation sources for a number of applications include known ultraviolet lighting equipment with energy intensity settings of, for example, 125 watts, 200 watts, and 300 watts per square inch.

Additional advantages and modifications will readily occur to those skilled in the art. Therefore, the invention in its broader aspects is not limited to the specific details, representative devices, and illustrative examples shown and described. Accordingly, departures may be made from such details without departing from the spirit or scope of the general inventive concept.

What is claimed is:

1. A photocurable silver composition comprising:
   a photocurable organic mixture;
   a photoinitiator;
   silver powder; and
   silver flakes in an amount of at least 20% relative to the weight of the silver powder and wherein the photocurable organic mixture comprises:
   an aliphatic acrylated urethane oligomer;
   an acrylated epoxy oligomer; and
   an isobornyl acrylate monomer.

2. The silver composition recited in claim 1 further comprising a flow promoting agent.

3. The silver composition recited in claim 1, wherein the aliphatic acrylated urethane oligomer is present in an amount of about 3% to 8% of the silver composition.

4. The silver composition recited in claim 1, wherein the acrylated epoxy oligomer is present in an amount of about 2% to 4% of the silver composition.

5. The silver composition recited in claim 1, wherein the isobornyl acrylate monomer is present in an amount of about 4% to 8% of the silver composition.

6. The silver composition recited in claim 1, wherein the silver powder is present in an amount of about 50% to 60% of the silver composition.

7. The silver composition recited in claim 2, wherein the silver flakes are present in an amount of about 25% to 35% of the silver composition.

8. The silver composition recited in claim 1, wherein the aliphatic acrylated urethane oligomer is present in an amount of about 8% of the silver composition.

9. The silver composition recited in claim 1, wherein the photoinitiator is present in an amount of about 3% to 6% of the silver composition.

10. The silver composition recited in claim 2, wherein the flow promoting agent is present in an amount of about 0.1% to 2% of the silver composition.

11. The silver composition recited in claim 1, wherein the acrylated epoxy oligomer is present in an amount of about 3% of the silver composition.

12. The silver composition recited in claim 1, wherein the isobornyl acrylate monomer is present in an amount of about 5% of the silver composition.

13. The silver composition recited in claim 1, wherein the photoinitiator is present in an amount of about 5% of the silver composition.

14. The silver composition recited in claim 2, wherein the flow promoting agent is present in an amount of about 1% of the silver composition.

15. A silver composition as recited in claim 1, wherein the silver powder is present in an amount of about 52% of the silver composition.

16. The silver composition recited in claim 1 further comprising an adhesion promoter.

17. The silver composition recited in claim 1 further comprising:
   a flow promoting agent;
   a wetting agent; and
   a conductive carbon black powder.

18. The silver composition recited in claim 1 further comprising an antimony tin oxide powder and a flow promoting agent.

19. The silver composition recited in claim 18 further comprising a blend of a polyacrylic oligomer and an acrylate monomer.

20. A photocurable silver composition comprising:
   a photocurable organic mixture;
   a photoinitiator;
   silver powder; and
   silver flakes in an amount of at least 20% relative to the weight of the silver powder and wherein the photocurable organic mixture comprises:
   an acrylated epoxy oligomer; and
   an isobornyl acrylate monomer.

21. The photocurable silver composition of claim 20 further comprising a flow promoting agent.

22. A silver composition as recited in claim 1, wherein the silver powder has a particle size range of about 5 microns to about 15 microns.

23. A photocurable silver composition comprising:
   a photocurable organic mixture;
   a photoinitiator;
   silver powder; and
   silver flakes in an amount of at least 20% relative to the weight of the silver powder and wherein the silver powder comprises a plurality of particles, and wherein about 5% to 20% of the particles have a particle size of less than about 4.7 microns, about 30% to 60% of the particles have a particle size of less than about 7.6 microns, and about 70% to 95% of the particles have a particle size of less than about 14.9 microns.

24. The silver composition recited in claim 23, wherein the silver powder comprises a plurality of particles, and wherein about 10% of the particles have a particle size of less than about 4.7 microns, about 50% of the particles have a particle size of less than about 7.6 microns, and about 90% of the particles have a particle size of less than about 14.9 microns.

25. The silver composition as recited in claim 23, wherein the silver flake is present in an amount of about 30% of the silver composition.

26. The silver composition recited in claim 23, wherein the silver flake has a particle size range of about 5 microns to about 32 microns.

27. The silver composition recited in claim 23, wherein the silver flake comprises a plurality of particles, and wherein about 10% of the particles have a particle size of less than about 5.5 microns, about 50% of the particles have a particle size of less than about 12.5 microns, and about 90% of the particles have a particle size of less than about 32.0 microns.

28. A method for making a photocurable silver composition, the method comprising:
   a) mixing an isobornyl acrylate monomer and a photoinitiator to create a first mixture, the isobornyl acrylate monomer being present in an amount of about 4% to 8% of the silver composition, and the photoinitiator being present in an amount of about 4% to 6% of the silver composition;
   b) mixing an aliphatic acrylated oligomer and an acrylated epoxy oligomer to create a second mixture, the aliphatic acrylated oligomer being present in an amount of about 3% to 8% of the silver composition and the acrylated epoxy oligomer being present in an amount of about 2% to 4% of the silver composition;
   c) mixing a silver powder and a silver flake composition to create a third mixture, the silver powder being present in an amount of about 50% to 60% of the silver composition and the silver flake composition being present in an amount of about 25% to 35% of the silver composition;

d) selecting a flow promoting agent in an amount of about 0.1% to 2% of the silver composition; and mixing the mixtures a), b), and c) with the flow promoting agent d) to create the silver composition.

29. A method as recited in claim 28, wherein steps a, b, c, and d are performed sequentially.

30. A method for making a photocurable silver composition, the method comprising:

a first step of combining and mixing an isobornyl acrylate monomer and a photoinitiator to create a first composition, the isobornyl acrylate monomer being present in an amount of about 4% to 8% of the silver composition, and the photoinitiator being present in an amount of about 4% to 6% of the silver composition;

a second step of combining with the first composition and mixing an aliphatic acrylated oligomer and an acrylated epoxy oligomer to create a second mixture, the aliphatic acrylated oligomer being present in an amount of about 3% to 8% of the silver composition and the acrylated epoxy oligomer being present in an amount of about 2% to 4% of the silver composition;

a third step of combining with the second composition and mixing a silver powder and a silver flake composition to create a third composition, the silver powder being present in an amount of about 50% to 60% of the silver composition and the silver flake composition being present in an amount of about 25% to 35% of the silver composition; and a fourth step of combining with the third composition and mixing a flow promoting agent in an amount of about 0.1% to 2% of the silver composition.

31. A silver composition as recited in claim 1, wherein the silver powder comprises a plurality of particles, and wherein about 5% to 20% of the particles have a particle size of less than about 4.7 microns, about 30% to 60% of the particles have a particle size of less than about 7.6 microns, and about 70% to 95% of the particles have a particle size of less than about 14.9 microns.

32. A silver composition as recited in claim 1, wherein the silver powder comprises a plurality of particles, and wherein about 10% of the particles have a particle size of less than about 4.7 microns, about 50% of the particles have a particle size of less than about 7.6 microns, and about 90% of the particles have a particle size of less than about 14.9 microns.

33. A silver composition as recited in claim 1, wherein the silver flake is present in an amount of about 30% of the silver composition.

34. A silver composition as recited in claim 1, wherein the silver flake has a particle size range of about 5 microns to about 32 microns.

35. A silver composition as recited in claim 1, wherein the silver flake comprises a plurality of particles, and wherein about 10% of the particles have a particle size of less than about 5.5 microns, about 50% of the particles have a particle size of less than about 12.5 microns, and about 90% of the particles have a particle size of less than about 32.0 microns.

* * * * *

UNITED STATES PATENT AND TRADEMARK OFFICE
CERTIFICATE OF CORRECTION

PATENT NO. : 6,290,881 B1
DATED : September 18, 2001
INVENTOR(S) : Roy C. Krohn

It is certified that error appears in the above-identified patent and that said Letters Patent is hereby corrected as shown below:

<u>Column 19,</u>
Line 31, delete "claim 2" and insert therefor -- claim 1 --.

Signed and Sealed this

Twenty-fourth Day of December, 2002

JAMES E. ROGAN
*Director of the United States Patent and Trademark Office*